United States Patent [19]
Long et al.

[11] Patent Number: 5,811,984
[45] Date of Patent: Sep. 22, 1998

[54] CURRENT MODE I/O FOR DIGITAL CIRCUITS

[75] Inventors: Stephen I. Long, Santa Barbara, Calif.; Qi Zhang, Hazlet, N.J.

[73] Assignee: The Regents of the University of California, Oakland, Calif.

[21] Appl. No.: 539,581

[22] Filed: Oct. 5, 1995

[51] Int. Cl.⁶ .......................... H03K 17/16; H03K 19/175
[52] U.S. Cl. .................................. 326/30; 326/96; 326/86
[58] Field of Search .................................. 326/30, 90, 86

[56] References Cited

U.S. PATENT DOCUMENTS

| | | | |
|---|---|---|---|
| 3,832,575 | 8/1974 | Dasgupta et al. | 326/30 |
| 5,134,311 | 7/1992 | Biber et al. | |
| 5,164,663 | 11/1992 | Alcorn | 326/30 |
| 5,166,561 | 11/1992 | Okura | 326/30 |
| 5,347,177 | 9/1994 | Lipp | 326/30 |
| 5,528,168 | 6/1996 | Kleveland | 326/30 |
| 5,585,741 | 12/1996 | Jordan | 326/30 |

OTHER PUBLICATIONS

Ishibe et al., "Pure CMOS I/O Buffer Circuits", 1991 Symposium on VLSI Circuits, 1991, pp. 47–48.

Kawahara et al., "Low–Power Chip Interconnection by Dynamic Termination", IEEE Journal of Solid–State Circuits, Sep. 1995, vol. 30, No. 9, pp. 1030–1031.

Kameyama et al., "Multiplier Chip with Multiple–Valued Bidirectional Current–Mode Logic Circuits", Computer, Apr. 1988, vol. 21, No. 4, pp. 43–56.

Primary Examiner—Edward P. Westin
Assistant Examiner—Richard Roseeh
Attorney, Agent, or Firm—Fish & Richardson P.C.

[57] ABSTRACT

A digital input/output interface for use with two digital circuits connected by a transmission line having a characteristic impedance $Z_O$ includes a current driver in one of the digital circuits and a current receiver in the other digital circuit. The current driver is configured to generate a current in the transmission line when a digital signal is applied to the current driver. The current receiver includes a current conversion element connected to the transmission line at an input node through an input impedance $Z_{in}$ and adapted to convert the current in the transmission line into an output voltage, and an active termination element configured to actively adjust the input impedance $Z_{in}$ to match the characteristic impedance $Z_O$ of the transmission line. An impedance transforming receiver for use with a transmission line having a small characteristic impedance $Z_O$ and carrying a relatively small current mode signal includes the following: an input element connected to the transmission line and configured to receive the small current mode signal, the input element having a small input impedance $Z_{in}$ that substantially matches the characteristic impedance of the transmission line; and a high impedance output element adapted to convert the small current mode signal into an output binary voltage having a noise margin large enough for digital communication.

39 Claims, 9 Drawing Sheets

CURRENT MODE I/O FOR DIGITAL CIRCUITS

This invention was made with Government support under Grant No. N00014-88-K-0497, awarded by the Office of Naval Research, and Grant No. DABT63-93-C-0039, awarded by the Army. The Government has certain rights in this invention.

BACKGROUND OF THE INVENTION

The invention relates generally to current mode input/output (I/O) for digital circuits, and more particularly to a system that allows relatively small current mode signals to be transmitted through a transmission line and converted to output voltages large enough for digital communication.

Digital circuits communicate by sending signals through internal input/output (I/O) interfaces via transmission lines. Typically, the characteristic impedance of a transmission line varies between 50 ohms and 75 ohms, depending on line widths, spacings, and dielectric constant. To prevent signal reflections in the transmission line, the impedance of the I/O interface in each digital circuit must be matched, as closely as possible, to the transmission line's characteristic impedance.

In general, digital communication requires voltage swings of at least 0.5 volts to provide adequate noise margin. Because most digital interfaces consist of low-impedance components, relatively large current swings (e.g. between 10 mA and 40 mA) are required to generate sufficiently large voltage swings. Unfortunately, large current swings lead to large power dissipation and simultaneous switching noise in the digital circuits. Table I shows the values of current swing and power dissipation associated with several types of digital I/O techniques (i.e., emitter-coupled logic (ECL), gunning transceiver logic (GTL), random access memory bus interface (RAMBUS), and buffered-transistor logic (BTL)).

TABLE I

Comparison of the power dissipation requirements for several I/O techniques.

| I/O Technique | Integrated Circuit (IC) Technology | Power (mW) | Current Swing (mA) |
|---|---|---|---|
| ECL | Silicon bi-polar junction transistor (Si BJT), Gallium arsenide (GaAs) | 32 | 16 |
| GTL | Complimentary metal-oxide semiconductor (CMOS) | 19.2 | 32 |
| RAMBUS | CMOS | 15 | 12 |
| BTL | Si BJT | 42 | 40 |

Figure 1A:
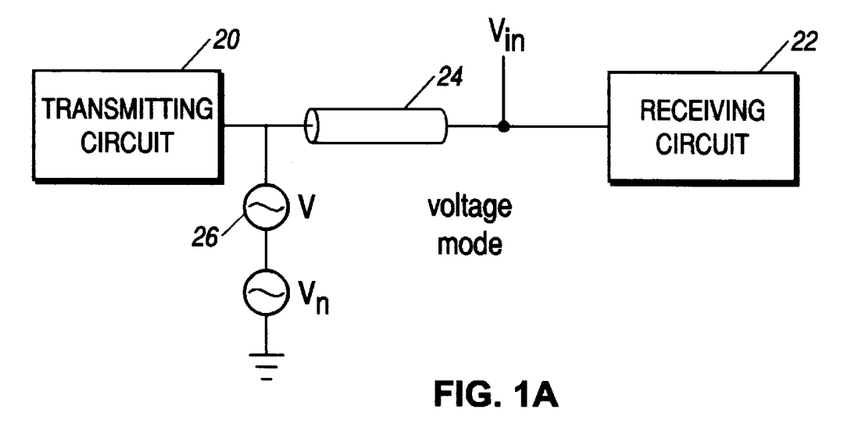
FIGS. 1A, 1B, 2A, and 2B are schematic views of conventional digital I/O interfaces.
Figure 1B:
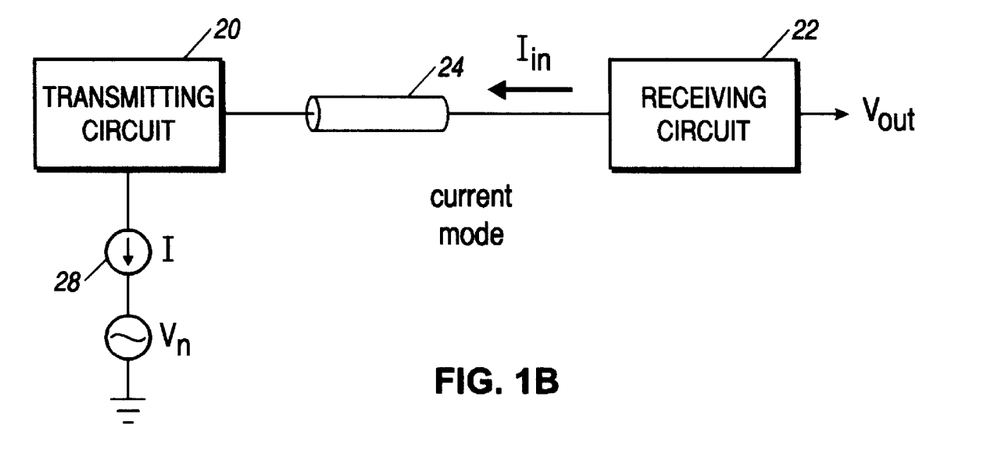

In high-speed digital circuits, ground noise often interferes with communication signals. FIGS. 1A and 1B illustrate two types of digital communication techniques and how each technique deals with ground noise. As shown in FIG. 1A, voltage-mode communication requires the transmitting circuit 20 to generate an input voltage $V_{in}$ at the receiving circuit 22 through the transmission line 24. At the transmitting circuit 20, the input voltage $V_{in}$ acts as a voltage source 26 in series with the voltage $V_n$ created by ground noise. As a result, the voltage-mode interconnection adds the ground noise $V_n$ directly to the input signal, which reduces the available noise margin.

In the current-mode interconnection scheme of FIG. 1B, the transmitting circuit 20 generates a current $I_{in}$ in the receiving circuit 22 via the transmission line 24. The receiving circuit 22 in turn converts the current into a voltage value $V_{out}$. In the current-mode scheme, the input signal acts as a current source 28 in series with voltage $V_n$ created by ground noise. Unlike signals in the voltage-mode scheme, the current-mode input signal attenuates the ground noise $V_n$ to increase the available noise margin.

Figure 2A:
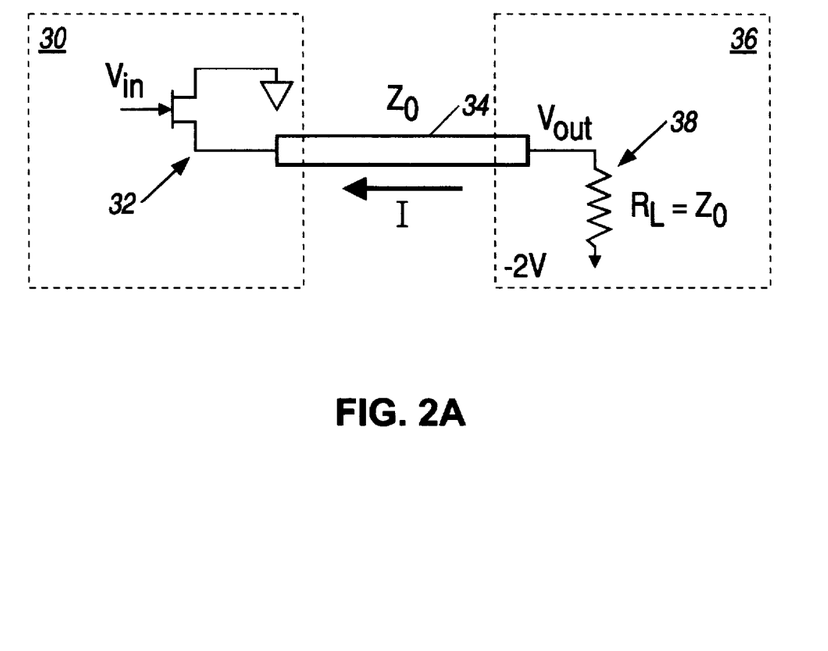
Figure 2B:
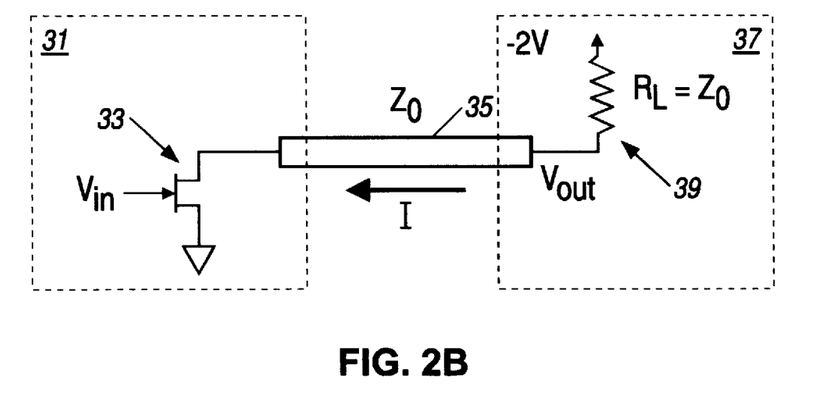

FIGS. 2A and 2B show typical current-mode interconnection schemes. In FIG. 2A, a transmitting circuit 30 consists of an open-source field-effect transistor (FET) driver 32 that pulls a current I through a low-impedance transmission line 34 when activated by an input voltage $V_{in}$. The receiving circuit 36 includes a resistor 38 connected to a −2 volt supply that converts the current I into an output voltage $V_{out}$. The resistance $R_L$ of the resistor 38 must equal the characteristic impedance $Z_0$ of the transmission line 34. In FIG. 2B, the transmitting circuit 31 includes an open-drain driver 33 that pulls a current I through the transmission line 35 when activated by the input voltage $V_{in}$. In the receiver 37, a resistor 39 connected to a +2 volt supply converts the current I into an output voltage $V_{out}$. The resistance $R_L$ of resistor 39 also must equal the characteristic impedance $Z_0$ of the transmission line 35. In both current-mode schemes (FIGS. 2A and 2B), the low values of the resistors 38 (which must match the low impedance of the transmission line 34), require relatively large current swings to generate sufficiently large output voltage swings, as discussed above.

It should also be noted that the driver in FIG. 2A often is designed with an output impedance much less than $Z_0$, especially for ECL interfaces implemented with bipolar transistors. The driver in FIG. 2B presents a high impedance to the transmission line, and the digital signal is therefore less influenced by ground noise as discussed above.

An object of the present invention is to reduce power dissipation in digital circuits by transmitting current mode signals with relatively small current swings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

In one aspect, the present invention is directed to a digital input/output interface for use with two digital circuits connected by a transmission line having a characteristic impedance $Z_0$, including a current driver in one of the digital circuits configured to generate a current in the transmission line when a digital signal is applied to the current driver, and a current receiver in the other digital circuit. The current receiver includes a current conversion element connected to the transmission line at an input node through an input impedance $Z_{in}$ and adapted to convert the current in the transmission line into an output voltage, and an active termination element configured to actively adjust the input impedance $Z_{in}$ to match the characteristic impedance $Z_0$ of the transmission line.

In another aspect, the present invention is directed to an impedance transforming receiver for use with a transmission line having a small characteristic impedance $Z_0$ and carrying a relatively small current mode signal, including an input element connected to the transmission line and configured to receive the small current mode signal, the input element having a small input impedance $Z_{in}$ that substantially matches the characteristic impedance of the transmission line; and a high impedance output element adapted to convert the small current mode signal into an output binary voltage having a noise margin large enough for digital communication.

In one aspect, the method of the present invention involves communicating between a first digital circuit and a second digital circuit over a transmission line having a characteristic impedance $Z_0$, the second digital circuit having an input impedance $Z_{in}$ that actively terminates the transmission line. The method includes the steps of generating a current in the transmission line in response to a digital signal in the first digital circuit, receiving the current in the second digital circuit, converting the current into an output voltage representing the digital signal, and adjusting the input impedance $Z_{in}$ of the second digital circuit to match the characteristic impedance $Z_0$ of the transmission line.

In another aspect, the method of the present invention involves communicating between a first digital circuit and a second digital circuit through a transmission line having a low characteristic impedance. The method includes the steps of generating a relatively small current in the transmission line in response to a digital signal in the first digital circuit, receiving the relatively small current in the second digital circuit through a low impedance that matches the low characteristic impedance of the transmission line, and passing the relatively small current through a high impedance element to generate an output voltage having a noise margin large enough for digital communication.

Advantages of the invention may include one or more of the following. Input impedance may be varied to match the characteristic impedance of a transmission line. This input impedance remains constant over a wide range of frequencies. Input impedance may be low enough to match the characteristic impedance of a low-impedance line. The low input impedance may be transformed to a high output impedance. As a result, current mode signals may be generated with relatively low current swings (e.g., 1 mA), which in turn may reduce power dissipation during digital communication. The high output impedance may convert the low-current current mode signals into output voltage levels with noise margins large enough for high speed digital communications.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DESCRIPTION OF THE PREFERRED EMBODIMENTS

The present invention will be described in terms of the preferred embodiment. The preferred embodiment is an apparatus and a method for communicating with current mode signals having relatively small current swings.

Figure 3:
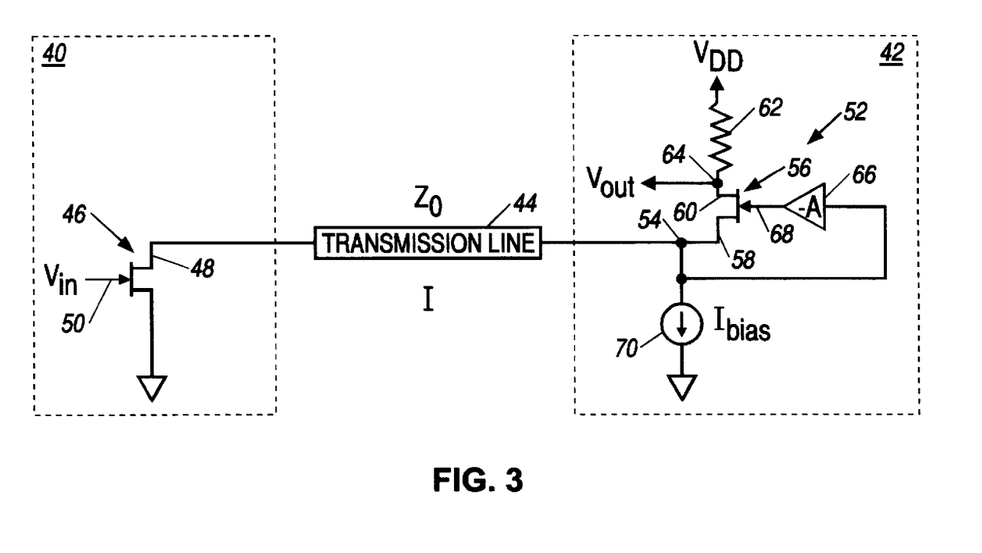
FIGS. 3 and 4 are schematic views of an active termination current mode I/O interface.

The digital I/O interface described below allows digital communications in the current mode with current swings much less than those required by prior technologies. As a result, the interface dissipates relatively little power in the driving and terminating circuits. The interface provides an active receiver with a low input impedance that varies to match the characteristic impedance of the transmission line at a wide range of frequencies. The receiver transforms the low input impedance into a high output impedance. The high output impedance allows the receiver to convert the low current swings into output voltage levels with noise margins large enough (e.g., 0.5 volts) for high speed digital communication. Such a structure is shown in FIG. 3.

Two digital circuits 40, 42 (e.g., integrated circuit "chips") communicate through a low impedance transmission line 44 (e.g., a signal trace on a printed circuit board) having a characteristic impedance of $Z_0$. The "transmitting" chip 40 includes a first stage of the current mode I/O interface (the transmitter). This is a high impedance FET driver 46 arranged in an open-drain configuration; i.e., the driver's drain node 48 connects directly to one end of the transmission line 44. The driver's gate node 50 receives as input a digital signal $V_{in}$ generated by the chip 40. When $V_{in}$ goes high, the driver 46 pulls a current through the transmission line 44 (hence the term "current mode I/O"). If the driver 46 is a high impedance device, such as an enhancement-type GaAs metal-semiconductor field-effect transistor (E-MESFET), the driver 46 may convert the input voltage $V_{in}$ into a current mode signal having a relatively low current swing, as discussed below.

The "receiving" chip 42 includes the second stage of the current mode I/O interface (the receiver) 52, which connects to the other end of the transmission line 44 at an input node 54. The receiver 52 performs several functions, including current mode signal conversion, low-to-high impedance transformation, and active impedance matching (line termination), each described below.

Current mode signal conversion is carried out by an output transistor 56. The transistor 56 may be any one of several types, such as GaAs MESFET, CMOS FET, and BJT. In an FET implementation, a source node 58 of the transistor 56 connects to the receiver's input node 54, and a drain node 60 of the transistor 56 connects to a load element 62 tied to a high-voltage rail $V_{DD}$. A bias current source 70 connected to the input node 54 draws a small bias current $I_{BIAS}$ through the transistor 56. When the driver 46 in the transmitting chip 40 is off (i.e., no current in the transmission line 44), only the small bias current $I_{BIAS}$ flows in the transistor 56, and load element 62 pulls the voltage $V_{out}$ at an output node 64 (i.e., the drain 60 of the transistor 56) to a high value. When the driver 46 is on, the current in the transmission line flows in the output transistor 56, and the output voltage $V_{out}$ is pulled to a low value.

The receiver 42 also performs a low-to-high impedance transformation between its input node 54 and its output node 64. To prevent line reflections in the low-impedance transmission line 44, the receiver's input impedance must match the line's characteristic impedance $Z_0$. As a result, the impedance at the source node 58 of the output transistor 56 must equal $Z_0$ at all times. However, to convert the small current swings into output voltage swings large enough for high speed digital applications (e.g., 0.5 volts or larger), the receiver's output impedance must be relatively high. As a result, the impedance of the load element 62 must be large enough to generate at least a 0.5 volt drop at the low currents generated when the input driver 46 in on.

The receiver 42 also contains a voltage amplifier 66 which amplifies and inverts the voltage at the input node 54 and adjusts the gate voltage of the transistor 56. This negative feedback, in combination with the transconductance of the transistor 56, sets the receiver's input impedance. If the delay time of the amplifier 66 is much smaller than the signal reset time, the amplifier 66 is able to terminate all reflections in the transmission line 44 over a wide bandwidth.

Figure 4:
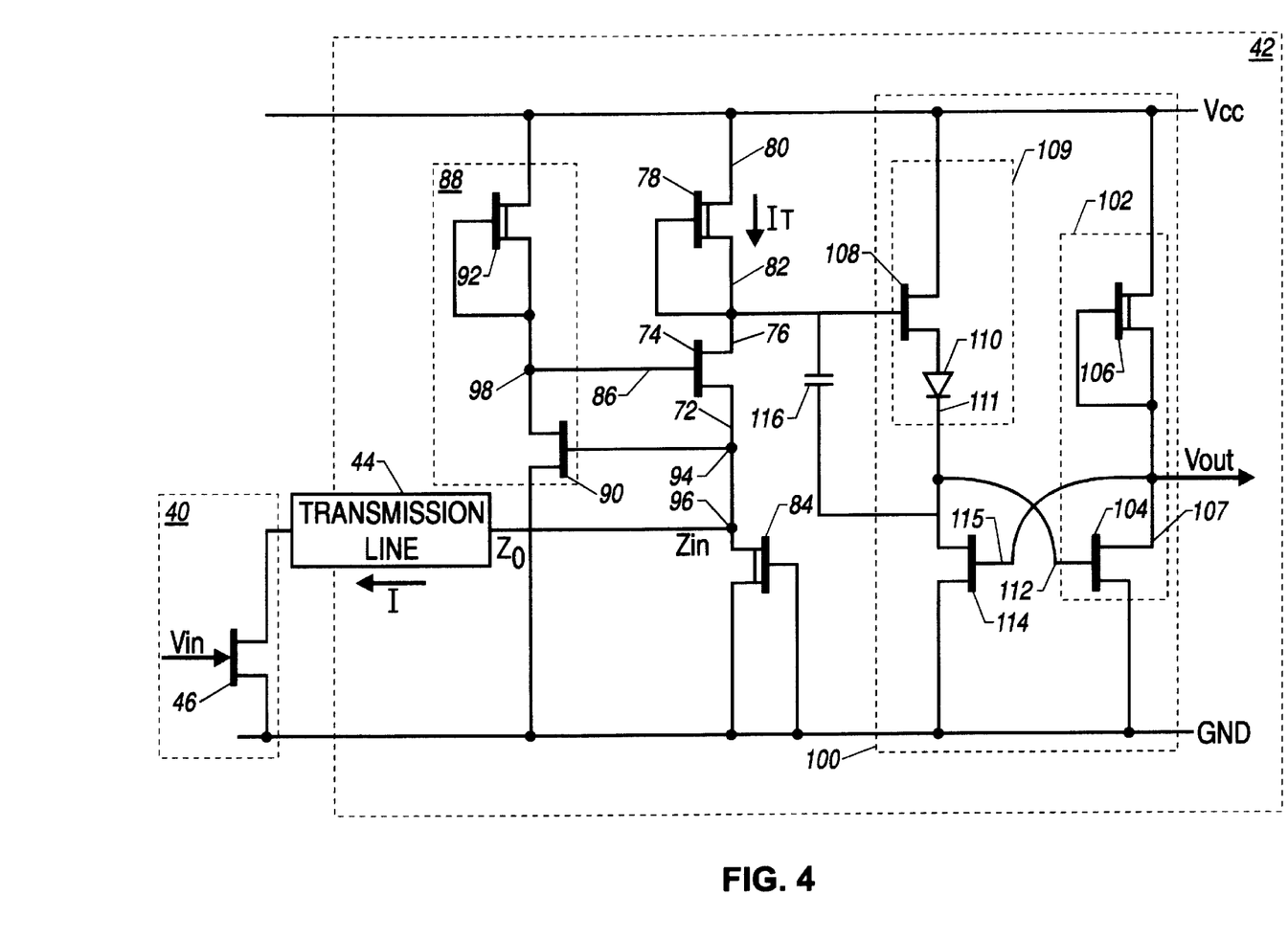

FIG. 4 shows the receiver 42 in more detail. The transmission line 44 terminates at a source 72 of an input transistor 74, an E-MESFET. A drain 76 of the input transistor 74 connects to a depletion-type GaAs metal-semiconductor field-effect transistor 78 (D-MESFET) that acts as a current threshold detector. The maximum (threshold) current $I_T$ that may flow from a drain 80 to a source 82 of the current detecting transistor 78 is determined by its channel width. When the current I in the transmission line 44 exceeds the threshold current $I_T$ (i.e., when the driver transistor 46 is on), the voltage drop across the current detecting transistor 78 is great, and the voltage at the drain 76 of the input transistor 74 is low (approximately 1.1 volts for a supply voltage $V_{CC}$ of 2.0 volts). When the current in the transmission line 44 falls below the threshold current $I_T$ (i.e., when the driver 46 shuts off), the voltage drop across the current threshold transistor 78 is slight, so the voltage at the input transistor's drain 76 is pulled to a high value (approximately 1.9 volts). An active load 84 connected to the source 72 of the input transistor 74 biases the input transistor 74 to conduct even when the driver 46 is off.

A voltage amplifier 88 of gain A controls the voltage at the input transistor's gate 86, and thus controls the receiver's input impedance $Z_{in}$. The amplifier 88 is a common source amplifier consisting of an E-MESFET 90 (the feedback transistor) and a D-MESFET 92. The amplifier's input node 94 (i.e., the gate of the feedback transistor) connects to the receiver's input node 96 (i.e., the source 72 of the input transistor 74), and the amplifier's drain node 98 provides gate voltage to the input transistor 74. In this configuration, voltage changes at the receiver's input node 96 govern the gate-to-source voltage of the feedback transistor 90, which in turn affects the gate voltage, and thus the source impedance, of the input transistor 74. Because the receiver's input impedance $Z_{in}$ is the impedance seen at the source 72 of the input transistor 74, the common source amplifier 88 is able to control the input impedance $Z_{in}$ in response to voltage changes at the input node 96, according to the following equation:

$$Z_{in} \approx 1/(A^* g_{m74}),$$

where $g_{74}$ is the transconductance of the input transistor 74 and A is the gain of the amplifier 88. The gain of the amplifier 88 is approximately $g_{m90}/(g_{o90}+g_{o92})$, where $g_{m90}$ is the transconductance of the feedback transistor 90, and $g_{o90}$ and $g_{o92}$ are the output conductances of the feedback transistor 90 and transistor 92, respectively. The input impedance $Z_{in}$ is maintained under process and temperature variations by the relatively constant $g_m/g_o$ ratio, which stabilizes the gain A of the amplifier 88, and by the negative feedback, which compensates for variations in $g_{m74}$.

The receiver 42 also includes an output buffer 100 that serves two purposes: 1) to shift the output voltage to standard direct-coupled FET logic (DCFL) levels (i.e., 0.1 volts to 0.7 volts); and 2) to provide stability at the output by "latching" the output voltage $V_{out}$. The output buffer 100 includes a DCFL output stage 102 having an E-MESFET output device 104 in series with a D-MESFET active load 106. If the output buffer 100 must drive the capacitance of a long interconnect line, other types of buffers, such as a superbuffer, may be used instead of a DCFL buffer.

In the DCFL buffer 100 of FIG. 4, the output voltage $V_{out}$ is determined by the voltage at a drain 107 of the output transistor 104. The buffer's input stage 109 includes a level-shifting E-MESFET 108 in series with a level-shifting diode 110, the cathode 111 of which connects to a gate 112 of the output transistor 104. The level-shifting transistor 108 and diode 110 shift the "high" voltage level at the drain 76 of the input transistor 74 from 1.9 volts to approximately 0.6 volts at the gate 112 of the output transistor 104. The buffer 100 also has a second E-MESFET transistor 114 ("a latching" transistor) that is cross-coupled with the output transistor 104 (i.e., the gate of one transistor connects to the drain of the other transistor) to "latch" the output voltage $V_{out}$.

The output buffer 100 receives as input the voltage at the drain 76 of the receiver's input transistor 74. When the drain voltage of the input transistor 74 is low (i.e., when $V_{in}$ is high and the driver 46 is on), the gate voltage 112 of the output transistor 104 is pulled low by the combination of the level-shifting circuit 109 and a feedforward capacitor 116. As a result, the output voltage $V_{out}$ is pulled high by the load transistor 106. As the output goes high, the latching transistor 114 is turned on, further pulling down and holding the gate voltage 112 of the output transistor 104 at a low level. This provides a latching effect due to the positive feedback of this connection.

When the driver 46 shuts off and the drain voltage of the input transistor 74 goes high, the level-shifting circuit 109 conducts heavily and pulls the gate 112 of the output transistor 104 high. This causes the output voltage $V_{out}$ to discharge a low logic level. At the same time, the latching transistor 114 is turned off, causing the output transistor's gate voltage 112 to rise to an even higher level, thus holding the output $V_{out}$ low more securely. The cross-coupled transistors 104 and 114 therefore stabilize the output voltage $V_{out}$ in both states by producing hysteresis.

The circuit of FIG. 4 also may be implemented using complementary MOS (CMOS) technology. In the CMOS circuit, the current detecting D-MESFET 78 is replaced by a diode-connected p-channel MOSFET, and the load element 84 is implemented with a diode-connected n-channel MOSFET. The amplifier 88 is implemented with a static CMOS inverter. The level-shifting transistor 108, the output transistor 104, and the latching transistor 114 are implemented with CMOS inverters. The width ratios of the CMOS transistors in the output buffer 100 are selected to adjust the threshold voltages appropriately. The circuit also may be implemented with bipolar junction transistors (BJT).

Experiments have shown that the current mode I/O interface of FIGS. 3 and 4 dissipates almost ten times less power than some prior digital interface technologies. Table II compares prior I/O techniques (first four rows) to two current mode I/O techniques according to the invention (last two rows). As shown in Table II, the current mode I/O interface described above dissipated only 4.4 mW (at a bandwidth of 1.2 gigabit/per second (Gb/s)) with 1 mA current swing, while other interface technologies tested under the same conditions dissipated between 15 mW (RAMBUS) and 42 mW (BTL) with current swings ranging from 16 mA to 40 mA. The current mode interface also has been operated at current swings as low as 570 microamps ($\mu$A). Even when implemented with CMOS (instead of GaAs) components, the current mode I/O interface dissipated only 7 mW. Bit-error rates for the current mode I/O interface were found to be less than $10^{-10}$ at data rates up to $1.2 \times 10^9$ bits per second and with pattern lengths up to $2^7$.

TABLE II

Comparison of the power dissipation requirements for several I/O techniques, including the current node I/O interface.

| I/O Technique | IC Technology | Power (mW) | Current Swing (mA) |
|---|---|---|---|
| ECL | Si BJT, GaAs | 32 | 16 |
| GTL | CMOS | 19.2 | 32 |
| RAMBUS | CMOS | 15 | 12 |
| BTL | Si BJT | 42 | 40 |
| Current Mode | CMOS | 7 | 1 |
| Current Mode | GaAs | 4.4 | 1 |

Figure 5:
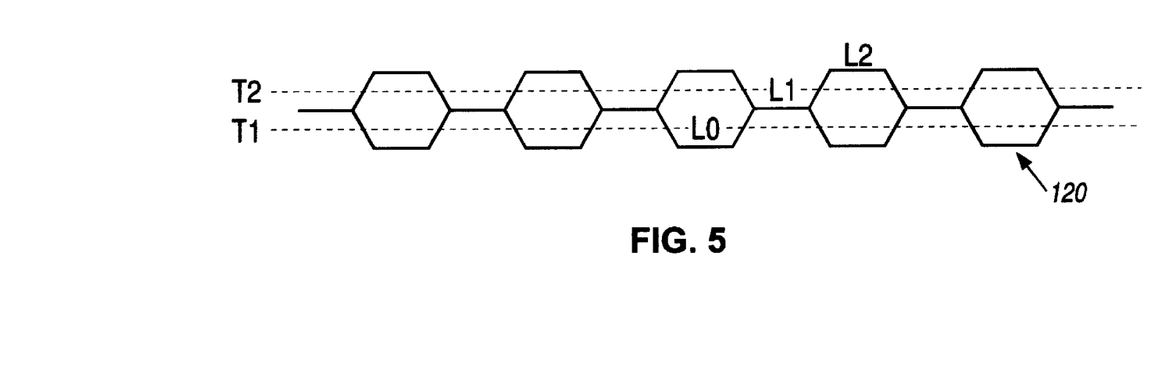
FIG. 5 is a diagram of a ternary logic signal.

The current mode I/O interface described above is ideal for multiple-level logic, such as the ternary logic scheme of FIG. 5. Ternary logic allows circuits to send two binary signals (e.g., a data signal and a clock signal) on one signal line. A ternary logic signal 120 has three different signal levels L0, L1, and L2 defined by two voltage or current threshold values T1 and T2. In the current mode I/O scheme, when the current in the signal is below the lower threshold value T1, the signal carries the lowest logic value L0; when the signal is between the threshold values T1, T2, the signal carries the intermediate logic value L1; when the signal is above the higher threshold value T2, the signal carries the highest logic value L2.

Table III is a truth table for a ternary logic signal carrying binary data and clock signals. If the clock signal is low (binary "0"), the ternary signal ($I_{TERNARY}$) has an intermediate value of "1", regardless of the binary value of the data signal. When the clock signal is high (binary "1"), the ternary signal has a low value "0" if the data signal is low and a high value "2" if the data signal is high. Therefore, for half of the clock cycle the ternary signal has an intermediate value "1", and during the other half cycle, the ternary signal has a high value "2" or a low value "0", depending upon the data value. The ternary logic signal always returns to the intermediate value "1" during every clock cycle.

TABLE III

Ternary logic truth table.

| Data | Clock | $I_{TERNARY}$ |
|---|---|---|
| X | 0 | 1 |
| 0 | 1 | 0 |
| 1 | 1 | 2 |

Figure 6:
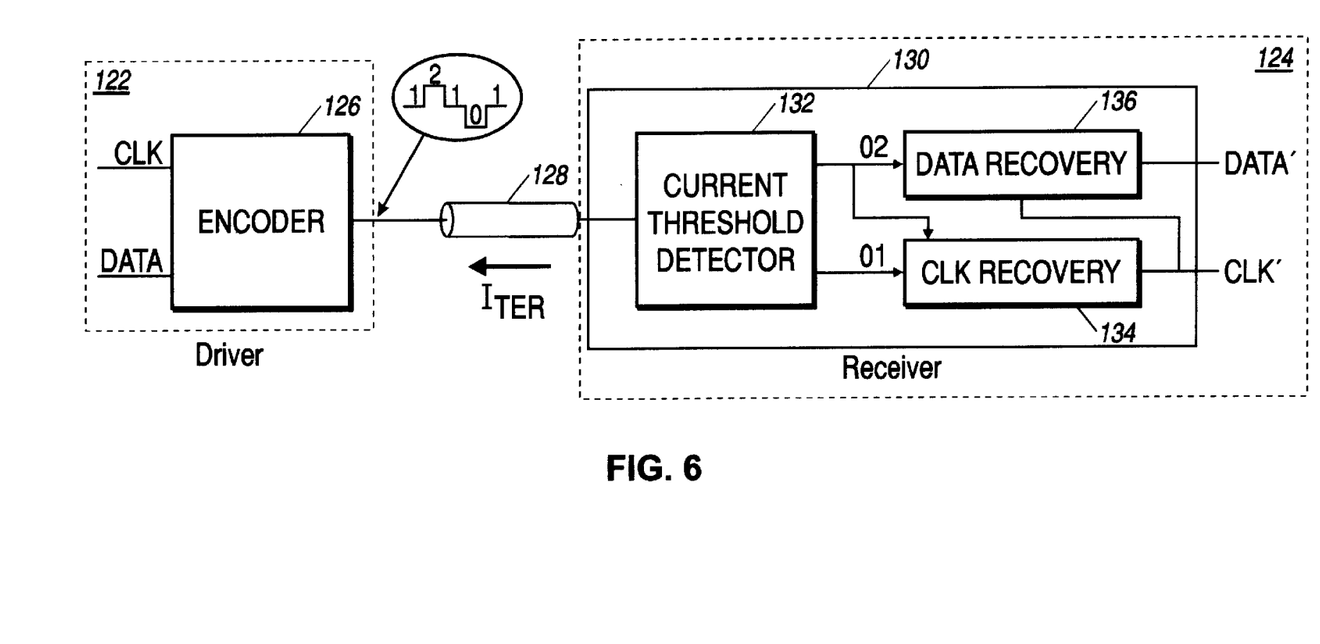
FIG. 6 is a block diagram of a current mode I/O interface for use with ternary logic.

FIG. 6 shows a current mode I/O interface configured for operation with ternary logic. A transmitting chip 122 includes a ternary logic encoder/driver 126 that receives a binary clock signal CLK and a binary data signal DATA. The encoder/driver 126 converts the two binary signals CLK and DATA into a ternary current signal $I_{TER}$ and transmits the ternary current signal $I_{TER}$ through a transmission line 128 to a receiver 130 in the receiving chip 124. In the receiver 130, a current threshold detector 132 converts the ternary current signal $I_{TER}$ into two binary output signals 01 and 02, the values of which depend upon the value of the ternary current signal $I_{TER}$. The binary output signals 01, 02 contain coded binary data representing the CLK and DATA signals. Clock and data recovery circuits 134, 136 decode the binary output signals 01, 02 to recover the original clock and data signals. The receiver 130 synchronizes the recovered clock signal CLK' and the recovered data signal DATA' by using the CLK' signal to trigger the data recovery circuit 136.

Figure 7:
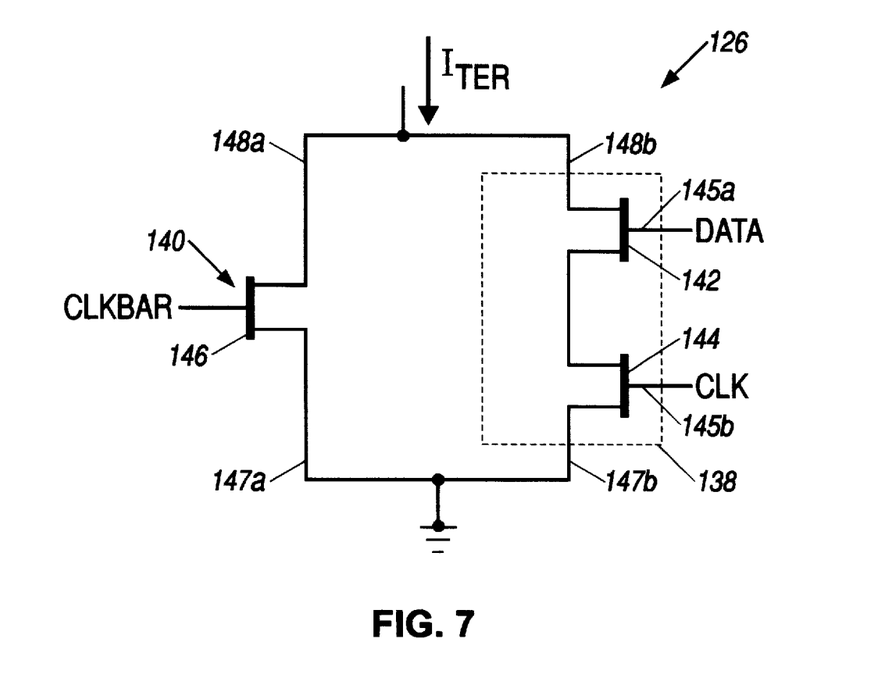
FIG. 7 is a schematic diagram of a ternary logic driver for a current mode I/O interface.

Referring to FIG. 7, the ternary logic encoder/driver 126 consists of two open-drain drivers 138, 140 connected in parallel. The first driver 138 consists of a pair of series-connected E-MESFETs 142, 144 having gates 145a, 145b driven by the CLK and DATA signals. The second driver 140 consists of a single E-MESFET 146 driven by the complement, CLKBAR, of the CLK signal. The sources 147a, 147b of the drivers 138, 140 connect to ground, and the drains 148a, 148b connect to the transmission line (not shown in FIG. 7).

When the CLK signal is low (i.e., less than the threshold voltage of the CLK transistor 144), the CLKBAR signal is high, so the CLKBAR transistor 146 is on, the CLK transistor 144 is off, and the second driver 140 generates a current in the transmission line. The value of this current is determined by the channel width of the CLKBAR transistor 146. For a transistor with a 24 micron ($\mu$m) channel width, the ternary current value is 1 mA. When the CLK signal goes high, the CLKBAR transistor 146 shuts off and the CLK transistor 144 turns on. The value of the DATA signal then determines whether a current is generated in the transmission line. If the DATA signal is low, the DATA transistor 142 is off and neither driver 138, 140 produces a current. If the DATA signal is high, the DATA transistor 142 begins conducting, and the first driver 138 generates the ternary current $I_{TER}$. The value of this current is determined by the combined channel width of the DATA and CLK transistors 142, 144, respectively. For transistors having channel widths of 160 $\mu$m and 120 $\mu$m, respectively, the ternary current value is 2.7 mA. The encoder/driver 126 thus generates a current having three possible values (0.0 mA, 1.0 mA, 2.7 mA), each representing a different combination of values for the CLK and DATA input signals.

Figure 8:
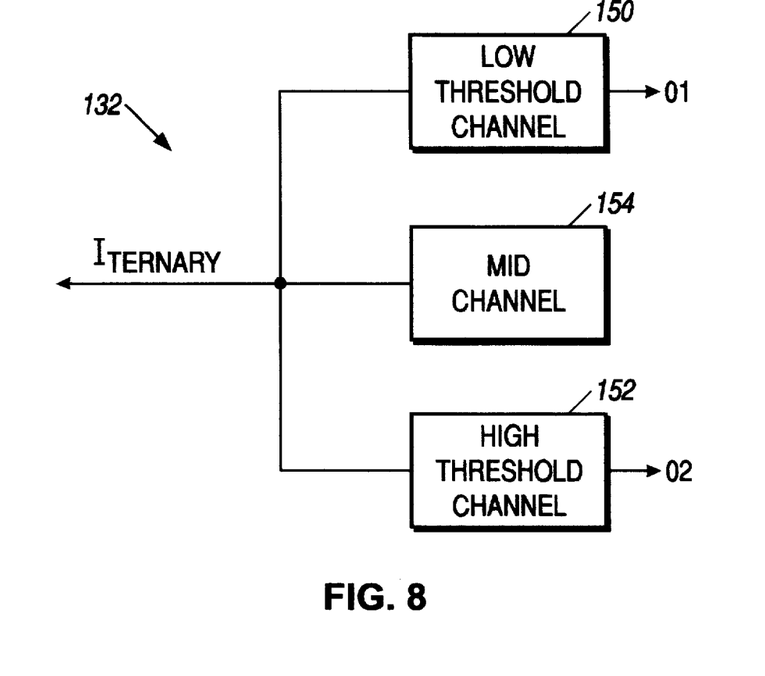
FIG. 8 is a schematic diagram of a ternary logic receiver.
Figure 9:
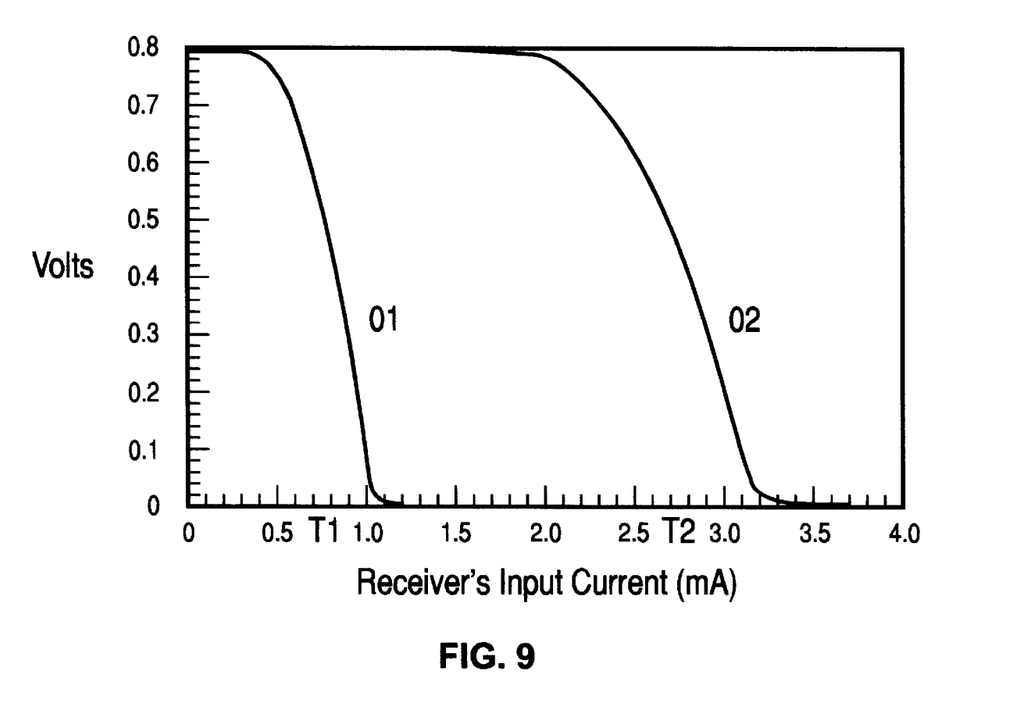
FIG. 9 is a graph of current threshold transfer functions.

Referring to FIG. 8, the threshold detector 132 in the receiver has two threshold-detecting channels: a low threshold channel 150 and a high threshold channel 152. The low channel 150 produces the first binary output signal 01, and the high channel 152 produces the second binary output signal 02. FIG. 9 is a graph showing the received current (in milliamps) on the horizontal axis and the value (in volts) of the binary output signals 01 and 02 on the vertical axis. As shown in FIG. 9, when the ternary current value is below the first threshold value T1 (approximately 1.0 mA), both binary output signals 01, 02 are high (approximately 0.7 volts, binary "1"). When the current exceeds the first threshold T1, the first binary output signal 01 goes low (binary "0"), and when the current exceeds the second threshold T2 (approximately 2.7 mA), the second binary output signal 02 goes low.

Because the receiver's input impedance must match the characteristic impedance of the transmission line at all times, each threshold detecting channel 150, 152 must actively determine the input impedance. When the ternary current level is low, the high channel 152 is in a high-impedance state (inactive), so the low channel 150 determines the receiver's input impedance. Likewise, when the ternary current level is high, the low channel 150 is in a high-impedance state, so the high channel 152 controls the input impedance. In the intermediate state, however, both channels 150, 152 are inactive. The threshold detector therefore includes a third channel 154 (a "mid-channel" receiver) which does not generate an output signal, but which controls the receiver's input impedance when the threshold detecting channels 150, 152 are inactive.

The mid-channel receiver 154 also enhances the noise margin between the two output channels. The current thresholds T1 and T2 may be spaced farther apart when the mid-channel receiver 154 is present to control the input impedance $Z_{in}$. Without the mid-channel receiver 154, threshold T2 would be no higher than the current level at which the low threshold channel makes its transition into a high impedance state. The wider current spacing increases the noise margin of the receiver.

Figure 10:
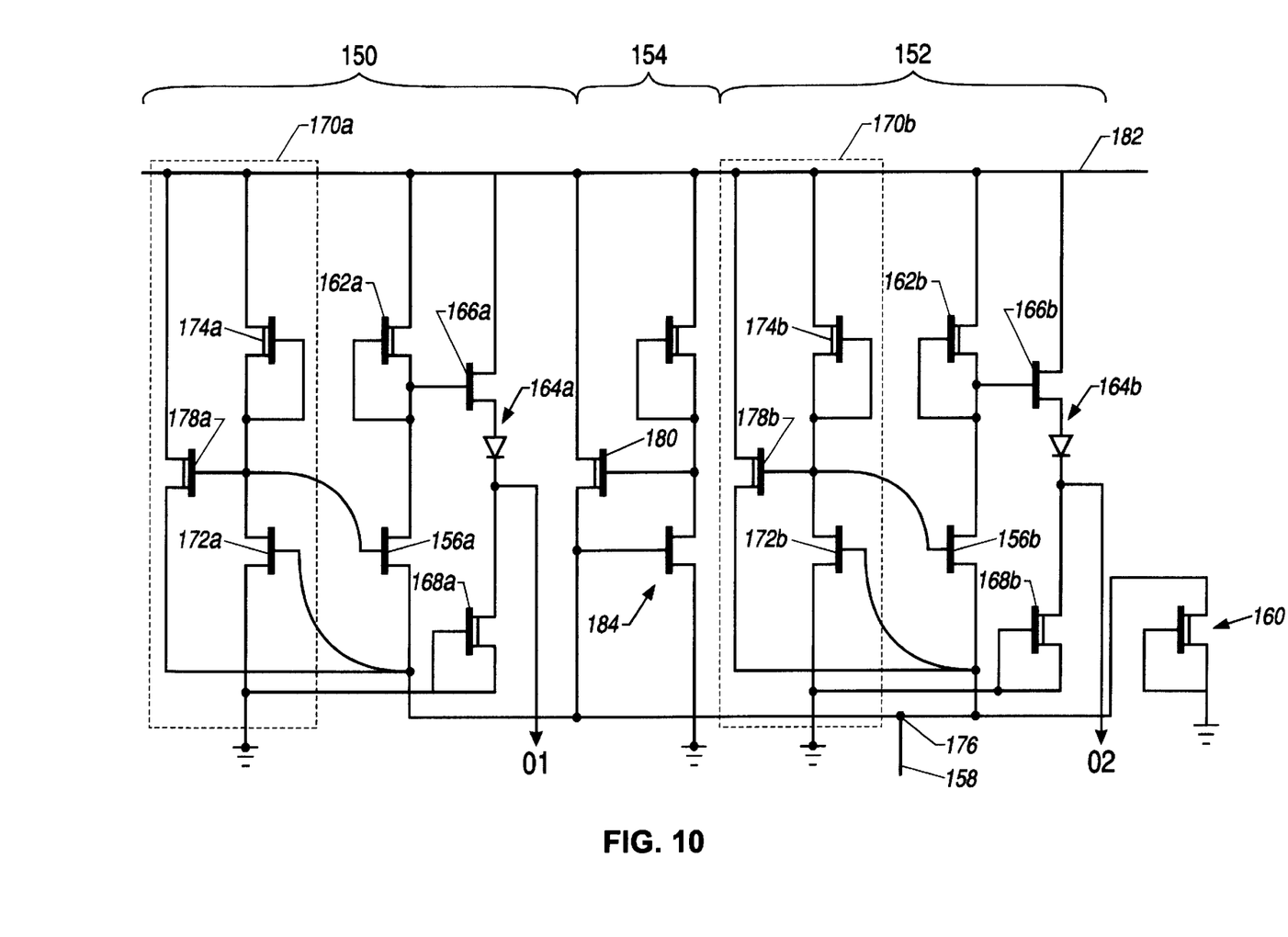
FIGS. 10 and 11 are schematic diagrams of a ternary logic receiver for a current mode I/O interface.

FIG. 10 shows the threshold detector in more detail. The two threshold detecting channels 150, 152 are essentially identical in structure, each very similar to the receiver shown in FIG. 4. Each channel includes an input E-MESFET 156a, 156b, the source of which is tied to the transmission line 158 at an input node 176. The source of each input transistor 156a, 156b also connects to a common biasing transistor 160, which ensures that the input transistors 156a, 156b always conduct. The drain of each input transistor 156a, 156b connects to a threshold detecting transistor 162a, 162b, respectively, that detects when the ternary current in the transmission line 158 exceeds the corresponding threshold. The current threshold of each threshold detecting channel 150, 152 is determined by the channel width of the threshold detecting transistor 162a, 162b. For the low threshold channel 150, the transistor width is 6 $\mu$m, and for the high threshold channel 152, the width is 12 $\mu$m.

The drain of each input transistor 156a, 156b also connects to a level-shifting circuit 164a, 164b, respectively, that shifts the corresponding binary output signal 01, 02 to standard DCFL voltage levels. When the ternary current into the channel 150, 152 is below the threshold value, the threshold detecting transistors 162a, 162b pull the gate of the level-shifting transistors 166a, 166b high, causing the level-shifting transistors 166a, 166b to conduct heavily. The relatively large current that results generates a large voltage across the corresponding load elements 168a, 168b, and the corresponding binary output signals 01, 02 go high. When the ternary current exceeds the threshold voltage, the level-shifting transistors 166a, 166b shut "off" and the load elements 168a, 168b pull the corresponding binary output signals 01, 02 to a low value. Unlike the circuit of FIG. 4, no "latching" transistors have been used in the threshold detecting channels 150, 152, although they may be added to increase stability if required.

Each channel 150, 152 also includes a voltage amplifier 170a, 170b that, together with the input transistors 156a, 156b, controls the input impedance of the channel. Like the circuit in FIG. 4, each amplifier 170a, 170b includes an E-MESFET 172a, 172b and a D-MESFET 174a, 174b connected in a common source configuration. The gates of the E-MESFETs 172a, 172b connect to the input node 176, and the drains connect to the gates of the input transistors 156a, 156b. The voltage amplifiers 170a, 170b operate like the amplifier 88 of FIG. 4. However, each amplifier 170a, 170b in the threshold detector includes an additional feedback transistor 178a, 178b, the gate of which connects to the voltage amplifier output, and the source of which connects to the input node 176. The second feedback transistors 178a, 178b enhance the amplifiers' ability to regulate input impedance by increasing the separation between the threshold currents T1 and T2 and by increasing the transimpedance (gain) in the transition regions.

During the intermediate logic state, the receiver's input impedance is governed by a mid-channel receiver 154 that includes an input transistor 180 (D-MESFET) connected between the input node 176 and the high-voltage rail 182. As with the threshold detecting channels 150, 152, the input impedance of the mid-channel receiver 154 is controlled by a common source amplifier 184. Unlike the other channels, the mid-channel receiver 154 is always active. This channel assures impedance matching during the intermediate logic state and spaces the transfer characteristics of the threshold detecting channels 150, 152.

Figure 11:
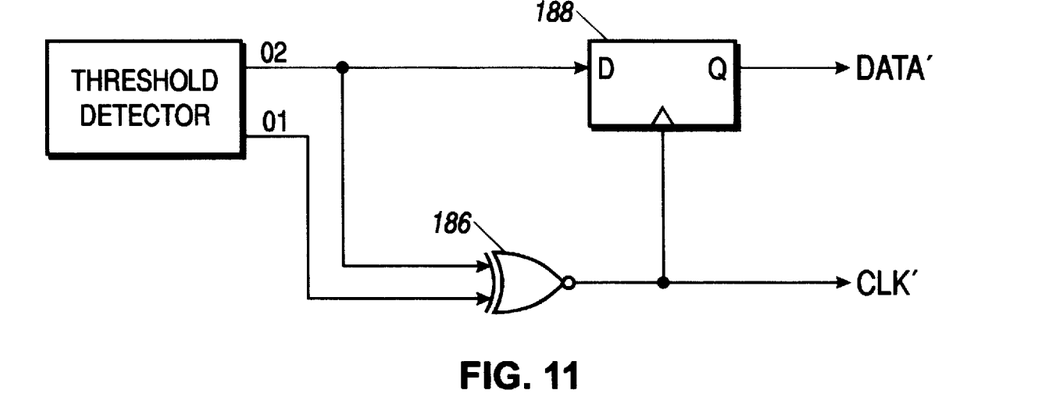

Referring to FIG. 11, the clock recovery circuit (134 in FIG. 6) is an exclusive NOR (XNOR) gate 186 that receives the binary output signals 01, 02 as input. Because the CLK signal is high only when the ternary logic signal is in state "0" or state "2", the clock recovery circuit 186 generates a high output only when the binary output signals 01, 02 have the same value (see FIG. 9). The data recovery circuit (136 in FIG. 6) is a D-latch 188 that receives only the second binary output signal 02 as input. The recovered clock signal CLK' is used to trigger the latch 188. Thus, when a clock pulse is detected, the data recovery latch 188 reads the value of the second binary output signal 02 and outputs this value as the recovered data signal DATA'. If the value of the original data signal is high during a clock pulse, the value of 02 will be high when the CLK' signal rises, and the data recovery latch 188 will output a high value for the DATA' signal. If the original data signal is low, the 02 signal also will be low, and the data recovery latch 188 will output a low value for the DATA' signal.

In summary, an apparatus and a method for communicating with current mode signals having relatively small current swings have been described.

The present invention has been described in terms of a preferred embodiment. The invention, however, is not limited to the embodiment depicted and described. Rather, the scope of the invention is defined by the appended claims.

What is claimed is:

1. A digital input/output interface for use with two digital circuits connected by a transmission line having a characteristic impedance $Z_o$, including:
  a current driver in one of the digital circuits configured to generate a current in the transmission line when a digital signal is applied to the current driver; and
  a current receiver in the other digital circuit including
    a current conversion element connected to the transmission line at an input node through an input impedance $Z_{in}$ and adapted to convert the current in the transmission line into an output voltage, and
    an active termination element configured to actively adjust the input impedance $Z_{in}$ to match the characteristic impedance $Z_o$ of the transmission line.

2. The digital input/output interface of claim 1 wherein the active termination element controls the input impedance in response to changes in voltage at the input node.

3. The digital input/output interface of claim 1 wherein the active termination element comprises a voltage amplifier.

4. The digital input/output interface of claim 1 wherein the current conversion element comprises a field-effect transistor.

5. The digital input/output interface of claim 4 wherein the input impedance $Z_{in}$ equals a fraction of the source impedance of the transistor.

6. The digital input/output interface of claim 5 wherein the active termination element comprises a voltage amplifier that provides feedback from the input node to control the source impedance of the transistor.

7. The digital input/output interface of claim 1 wherein the current conversion element comprises a bipolar junction transistor.

8. The digital input/output interface of claim 1 wherein the current driver comprises a field-effect transistor connected to said transmission line in an open-drain configuration.

9. The digital input/output interface of claim 1 wherein the current driver is a high-impedance device.

10. A signal receiver for a digital input/output interface connected to a transmission line having a characteristic impedance $Z_o$ and carrying a current mode signal, including:
   a current conversion element connected to the transmission line through an input impedance $Z_{in}$ and adapted to convert the current mode signal into an output voltage, and
   an active termination element configured to actively adjust the input impedance $Z_{in}$ to match the characteristic impedance $Z_o$ of the transmission line.

11. An impedance transforming receiver for use with a transmission line having a small characteristic impedance $Z_o$ and carrying a relatively small current mode signal, including:
   an input element connected to the transmission line and configured to receive the small current mode signal, the input element having a small input impedance $Z_{in}$ that substantially matches the characteristic impedance of the transmission line; and
   a high impedance output element adapted to convert the small current mode signal into an output binary voltage having a noise margin large enough for digital communication.

12. The impedance transforming receiver of claim 11 wherein a feedback amplifier connects between a source node and a gate node of a FET.

13. The impedance transforming receiver of claim 11 wherein the input element comprises a feedback amplifier.

14. The impedance transforming receiver of claim 11 wherein the output element comprises a high impedance load element.

15. The impedance transforming receiver of claim 14 wherein the load element comprises an active load element.

16. The impedance transforming receiver of claim 15 wherein the load element comprises a GaAs transistor.

17. The impedance transforming receiver of claim 15 wherein the load element comprises a MOSFET.

18. The impedance transforming receiver of claim 11 wherein the input element and the high impedance output element are able to respond to a current mode signal having a current swing as low as approximately 1 mA.

19. The impedance transforming receiver of claim 11 wherein the input element and the high impedance output element are able to respond to a current mode signal having a current swing smaller than 1 mA.

20. The impedance transforming receiver of claim 11 wherein an output voltage swing of at least 0.5 volts is obtained.

21. A digital input/output interface for use with two digital circuits connected by a transmission line having a characteristic impedance $Z_o$, including:
   a current driver in one of the digital circuits comprising a high impedance field-effect transistor connected to the transmission line in an open-drain configuration and configured to generate a relatively small current mode signal in the transmission line when a digital signal is applied to the current driver; and
   an impedance transforming receiver in the other digital circuit including:
      a transimpedance amplifier having a low input impedance $Z_{in}$ connected to the transmission line at an input node and configured to receive the relatively small current mode signal,
      a high-impedance load element connected to the field-effect transistor and configured to convert the relatively small current mode signal into an output binary voltage having a noise margin large enough for digital communication, and
      a feedback amplifier configured to adjust the input impedance $Z_{in}$ to match the characteristic impedance $Z_o$ of the transmission line based on changes in voltage at the input node.

22. A method of communicating between a first digital circuit and a second digital circuit over a transmission line having a characteristic impedance $Z_o$, the second digital circuit having an input impedance $Z_{in}$ that actively terminates the transmission line, the method including:
   generating a current in the transmission line in response to a digital signal in the first digital circuit;
   receiving the current in the second digital circuit;
   converting the current into an output voltage representing the digital signal; and
   adjusting the input impedance $Z_{in}$ of the second digital circuit to match the characteristic impedance $Z_o$ of the transmission line.

23. The method of claim 22 wherein the step of receiving the current is carried out by a transistor.

24. The method of claim 23 wherein the transistor comprises an FET.

25. The method of claim 23 wherein the transistor comprises a BJT.

26. The method of claim 23 wherein the input impedance of the second digital circuit equals a fraction of a source impedance of the transistor.

27. The method of claim 26 wherein the step of adjusting the input impedance comprises using a feedback amplifier to adjust the source impedance of the transistor.

28. The method of claim 22 wherein the step of converting the current into an output voltage comprises passing the current through a load element.

29. The method of claim 28 wherein the load element comprises an active load.

30. The method of claim 22 wherein the step of generating a current in the transmission line comprises:
   applying the digital signal to a gate of a driving transistor in the first digital circuit,
   pulling the current through the transmission line when the digital signal has a first value, and
   allowing the driver transistor to act as an open circuit when the digital signal has a second value.

31. A method of communicating between a first digital circuit and a second digital circuit through a transmission line having a low characteristic impedance, including:
   generating a relatively small current in the transmission line in response to a digital signal in the first digital circuit;
   receiving the relatively small current in the second digital circuit through a low input impedance that matches the low characteristic impedance of the transmission line; and passing the relatively small current through a high impedance element to generate an output voltage having a noise margin large enough for digital communication.

32. The method of claim 31 wherein the step of receiving the current is carried out by a transistor in the second digital circuit.

33. The method of claim 32 wherein the transistor is a FET.

34. The method of claim 32 wherein the transistor is a BJT.

35. The method of claim 32 wherein the low input impedance comprises a source impedance of the transistor.

36. The method of claim 35 further including actively terminating the transmission line at the second digital circuit by adjusting the source impedance of the transistor to match the low characteristic of the transmission line.

37. The method of claim 32 wherein the high impedance element comprises a load element connected to the transistor.

38. The method of claim 37 wherein the load element comprises an active load.

39. The method of claim 31 further including actively terminating the transmission line by adjusting the input impedance to match the low characteristic impedance of the transmission line.

* * * * *